United States Patent [19]

Kamiyama

[11] Patent Number: 5,279,985
[45] Date of Patent: Jan. 18, 1994

[54] SEMICONDUCTOR DEVICE AND METHOD OF FABRICATION THEREOF

[75] Inventor: Satoshi Kamiyama, Tokyo, Japan

[73] Assignee: NEC Corporation, Tokyo, Japan

[21] Appl. No.: 945,260

[22] Filed: Sep. 15, 1992

[30] Foreign Application Priority Data

Sep. 19, 1991 [JP] Japan .................... 3-238535

[51] Int. Cl.$^5$ ............................. H01L 21/70
[52] U.S. Cl. ....................... 437/60; 437/52; 437/235; 437/919; 148/DIG. 14; 148/DIG. 163
[58] Field of Search ............ 437/60, 52, 919, 235; 148/DIG. 14, DIG. 163

[56] References Cited

U.S. PATENT DOCUMENTS

| | | | |
|---|---|---|---|
| 4,794,563 | 12/1988 | Maeda | 437/60 |
| 4,977,102 | 12/1990 | Ema | 437/60 |
| 5,006,481 | 4/1991 | Chan et al. | 437/60 |
| 5,045,494 | 9/1991 | Choi et al. | 437/60 |
| 5,079,191 | 1/1992 | Shinriki et al. | 437/60 |
| 5,108,941 | 4/1992 | Paterson et al. | 437/60 |

OTHER PUBLICATIONS

Shinriki et al, "UV-$O_3$ and Dry-$O_2$: Two-Step Annealed Chemical Vapor-Deposited $Ta_2O_5$ Films for Storage Dielectrics of 64-Mb DRAM's", *IEEE Transactions on Electron Devices*, vol. 38, pp. 455-462, No. 3, Mar. 1991.

Primary Examiner—Brian E. Hearn
Assistant Examiner—Kevin M. Picardat
Attorney, Agent, or Firm—Burns, Doane, Swecker & Mathis

[57] ABSTRACT

The present invention relates to a semiconductor device and a method of fabrication of the same, said semiconductor device including a capacitive structure comprising of a lower layer electrode consisting of a silicon material, a capacitive insulating film consisting of a tantalum oxide film and an upper layer electrode, said upper layer electrode comprising at least a titanium nitride film for covering said capacitive insulating film. Said method of fabrication comprises the steps of: forming the lower layer electrode; forming the capacitive insulating film for covering said lower layer electrode; and forming the titanium nitride film for covering said capacitive insulating film.

12 Claims, 6 Drawing Sheets

PRIOR ART

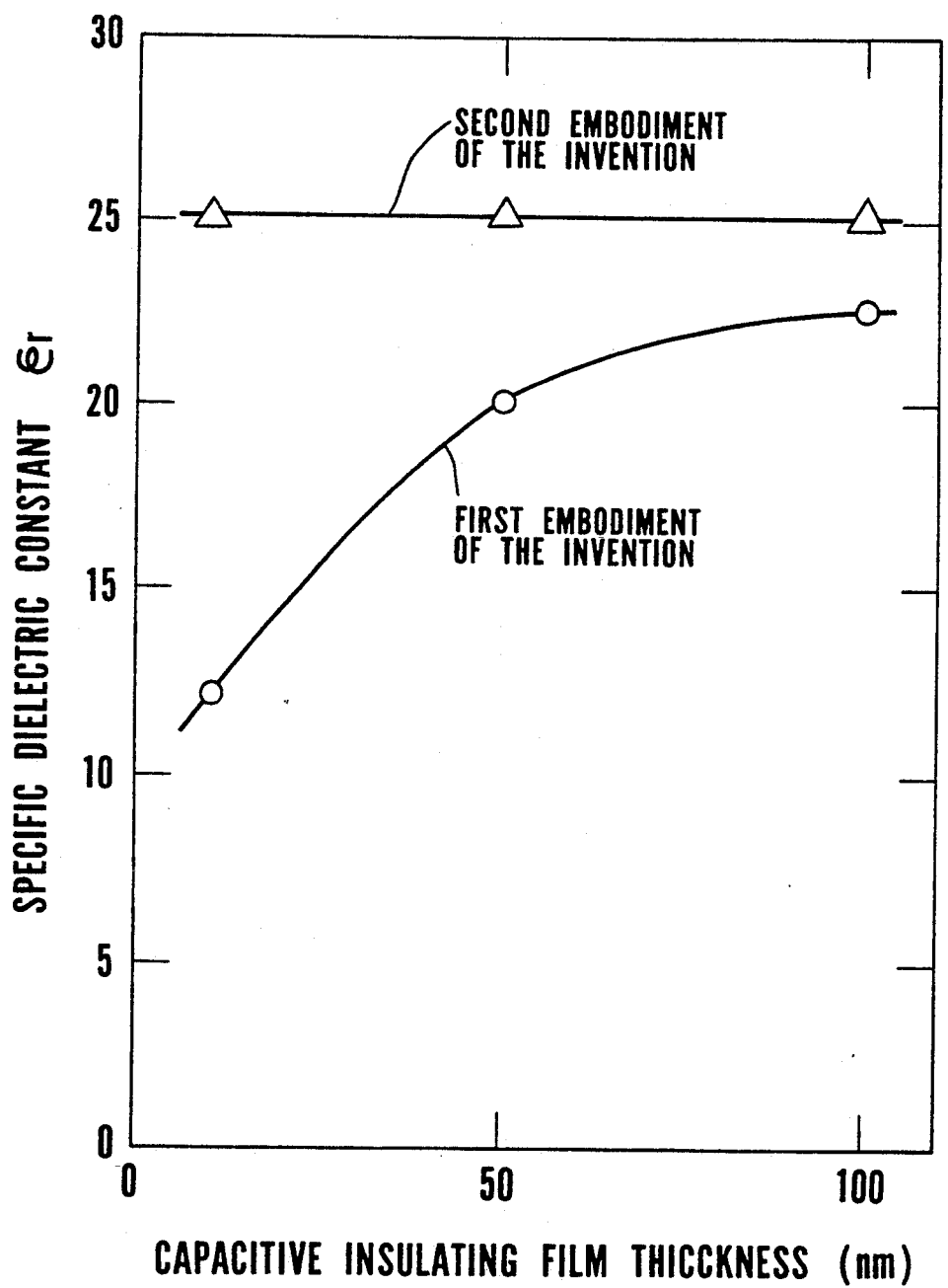

SEMICONDUCTOR DEVICE AND METHOD OF FABRICATION THEREOF

BACKGROUND OF THE INVENTION

1. Field of the Invention

The present invention relates to a semiconductor device and a method of fabrication thereof, and more specifically to a semiconductor device and a method of fabrication thereof, in which the semiconductor device includes a capacitive structure comprising a capacitive insulating film formed with a $Ta_2O_5$ film.

2. Description of the Prior Art

In recent ultra-large scale integrated circuit (LSI) memories many efforts are paid as an important subject to increase a capacity of a high dielectric tantalum oxide film per unit area.

Referring to FIG. 1, there is illustrated in a cross section a capacitive structure of a prior art DRAM with use of a tantalum oxide film. As illustrated in the figure, a device isolation oxide film 202 is selectively formed on the surface of a silicon substrate 201 with a gate oxide film formed thereon, and thereafter a gate electrode 203 serving also as a word line is formed together with impurity diffusion layers 205a, 205b as a source-drain region of a MOSFET formed on the surface of the silicon substrate 201. Simultaneously with the formation of the impurity diffusion layers 205a, 205b, a silicon oxide film 204 (the silicon oxide film includes a gate oxide film, a spacer oxide film, and a silicon oxide film for an interlayer insulating film) is formed.

A node contact is opened through the silicon oxide film 204 on the surface of the impurity diffusion layer 205a and a storage node electrode 206 comprising polycrystalline silicon is connected to the impurity diffusion layer 205a. Further, a capacitive insulating film 207 comprising a tantalum oxide film covering the surfaces of the storage node electrode 206 and the silicon oxide film is formed together with the formation of a plate electrode 208. The capacitive insulating film 207 excepting a portion of the same just under the plate electrode 208 is removed by etching. For the plate electrode 208, there are employed an aluminum (Al) metal film or a tungsten (W) film as a high melting point metal film, and a molybdenum (Mo) film. For the formation of the aluminum metal film there is employed vacuum deposition or sputtering, and for the formation of the tungsten or molybdenum film being the high melting point metal film there is employed sputtering.

The prior art capacitive structure described above however has the following difficulties: First, provided the plate electrode comprises the aluminum metal film, there occurs a reaction between aluminum and tantalum oxide upon film formation to cause a leakage current in the tantalum oxide film to be increased.

Contrarily, provided the plate electrode comprises the high melting point metal film such as a tungsten film, the leakage current through the tantalum oxide film is reduced compared with the case where the aluminum metal film is employed This originates from a fact that use of the high melting point metal film prevents the reaction with tantalum oxide from being produced. However, even the use of such a high melting point metal film as the plate electrode fails to ensure a highly reliable tantalum oxide film because there is left a problem in view of a practical current level.

SUMMARY OF THE INVENTION

In view of the drawbacks with the prior art, it is an object of the present invention to provide a semiconductor device and a method of fabrication thereof in which there is reduced a leakage current compared with the prior capacitive structure.

To achieve the above object, there is provided a semiconductor device according to the present invention, said semiconductor device including a capacitive structure comprising a lower layer electrode consisting of a silicon material, a capacitive insulating film consisting of a tantalum oxide film and an upper layer electrode, characterized in that said upper layer electrode comprises at least a titanium nitride film covering said capacitive insulating film.

Further, there is provided a method of fabrication of a semiconductor device according to the present invention, said semiconductor device including a capacitive structure comprising a lower layer electrode consisting of a silicon material, a capacitive insulating film consisting of a tantalum oxide film, and an upper layer electrode, said method comprising the steps of: forming the lower layer electrode; forming the capacitive insulating film covering the lower layer electrode, and forming the titanium nitride film covering the capacitive insulating film.

In accordance with a preferred embodiment of the aforementioned semiconductor device of the present invention, the device includes a high melting point metal film for covering the surface of said lower layer electrode and a titanium nitride film for covering said high melting point metal film between said lower layer electrode and said capacitive insulating film.

Further, in accordance with a preferred embodiment of the aforementioned method of fabrication of the semiconductor device of the present invention, said method includes the steps of forming the high melting point metal film covering the lower layer electrode after forming the lower layer electrode, and forming another titanium nitride film for covering the high melting point metal film.

BRIEF DESCRIPTION OF THE DRAWINGS

The above and other objects, features and advantages of the present invention will be better understood from reading the following description of the preferred embodiment taken in connection with the accompanying drawing in which:

FIG. 6 is a graphical view illustrating for comparison film thickness dependence of specific dielectric constants in the first and second concrete examples of the semiconductor device of the present invention.

DETAILED DESCRIPTION OF THE PREFERRED EMBODIMENTS

In the following, there will be described some preferred embodiments of a semiconductor device according to the present invention and a method of fabrication of the same with reference to the accompanying drawings of FIGS. 2 through 6.

Figure 2:
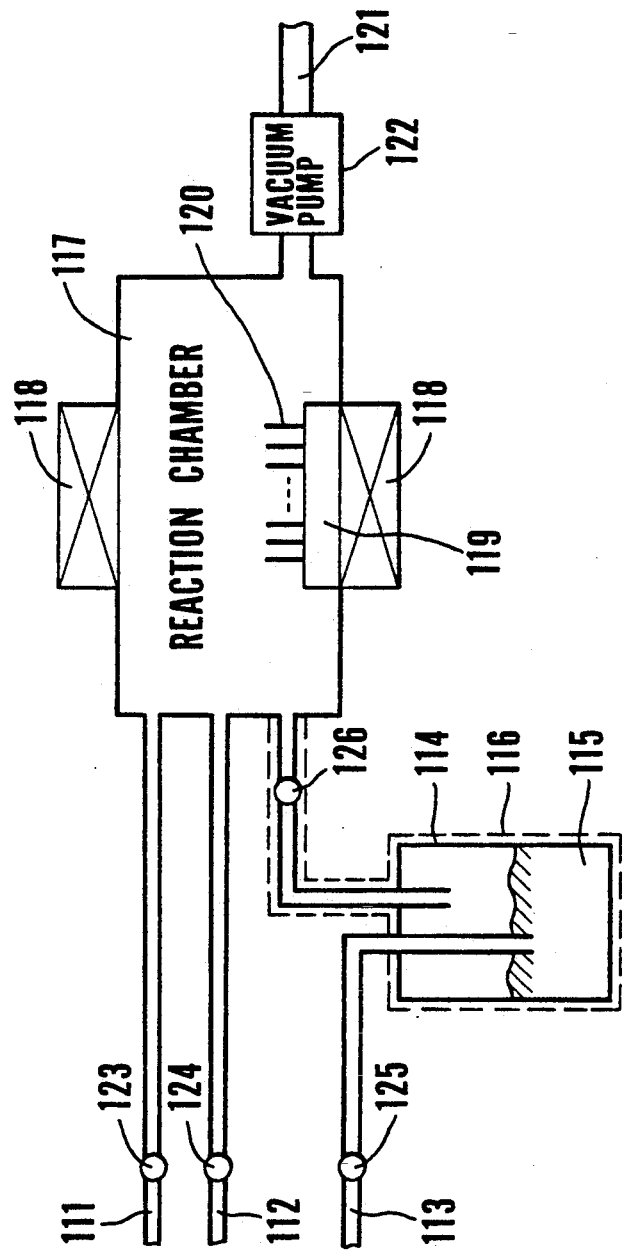
FIG. 2 is a schematical view exemplarily illustrating a fabrication apparatus of a semiconductor device according to the present invention.

First, there will be described a method of fabrication of a tantalum oxide film as a first concrete example of the present invention with reference to the schematical view of FIG. 2 illustrating the fabrication apparatus of the tantalum oxide film. Tantalum pentaethoxide (Ta($OC_2H_5$)$_5$) or tantalum pentamethoxide (Ta($OCH_3$)$_5$) being an organic stock material 115 is vaporized in a vaporization chamber 114 heated by a heater 116. The vaporized stock gas is introduced into a reaction chamber 117 through a valve 126 entrained by argon gas fed through a carrier gas introduction pipe 113 and a valve 125. In addition to the stock gas, there are fed into the reaction chamber 117 argon gas through an argon gas introduction pipe 111 and a valve 123 and oxygen gas through an oxygen gas introduction pipe 112 and a valve 124, the stock gas introduced into the reaction chamber 117 is reacted with the oxygen gas to cause a tantalum oxide film to be deposited on the surface of a wafer 120 placed on a substrate holder 119. These gases introduced into the reaction chamber 117 but not yet reacted are evacuated from an exhaust vent 121 by a vacuum pump 122. Growth conditions are as follows for example: heating temperature of the vaporization chamber 114 by the heater 116 is 50°~200° C., growth temperature in the reaction chamber 117 is 300°~800° C., the flow rate of the argon carrier gas is 10~200 SCCM, the flow rate of the oxygen gas is 0.1~5.0 SLM, and the pressure is 0.1~10 Torr.

Figure 3A:
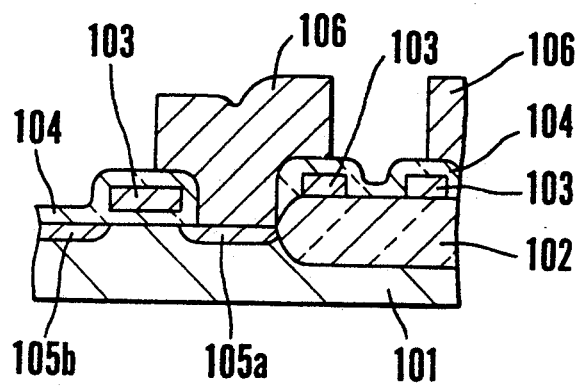
FIGS. 3A through 3C are views each illustrating processes of a first concrete example of a fabrication method of the semiconductor device of the present invention.
Figure 3B:
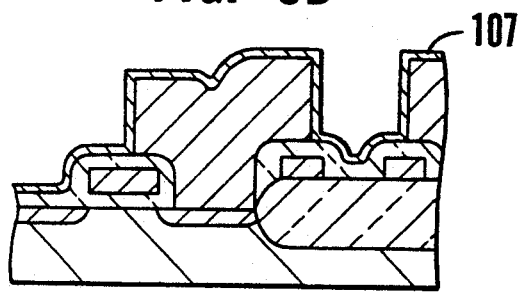
Figure 3C:
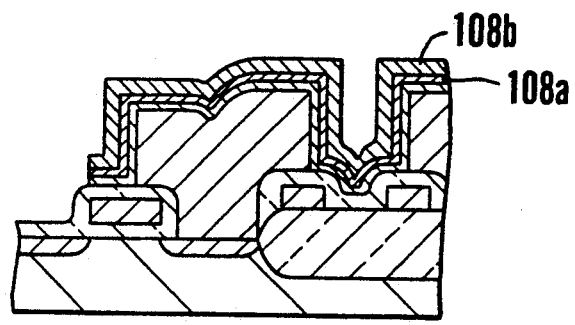

In the following, the aforementioned first concrete example will be described with respect to a first fabrication method thereof with reference to FIGS. 3A through 3C in which fabrication processes of a DRAM capacitive structure are illustrated in a cross section.

First, a device isolation oxide film 102 is selectively formed on the surface of a silicon substrate 101, and after a gate oxide film is formed, a gate electrode 103 which serves also as a word line is formed and impurity diffusion layers 105a, 105b which serve as a source-drain region of a MOSFET are formed on the surface of the silicon substrate 101. Simultaneously with the formation of the impurity diffusion layers 105a, 105b, a silicon oxide film 104 (the silicon oxide film includes a gate oxide film, a spacer oxide film, and an interlayer insulating silicon oxide film) is formed. A node contact is opened in the silicon oxide film 104 on the surface of the impurity diffusion layer 105a and a storage node electrode 106 comprising phosphorus doped polycrystalline silicon is connected with the impurity diffusion layer 105a as clearly seen in FIG. 3A.

Figure 1:
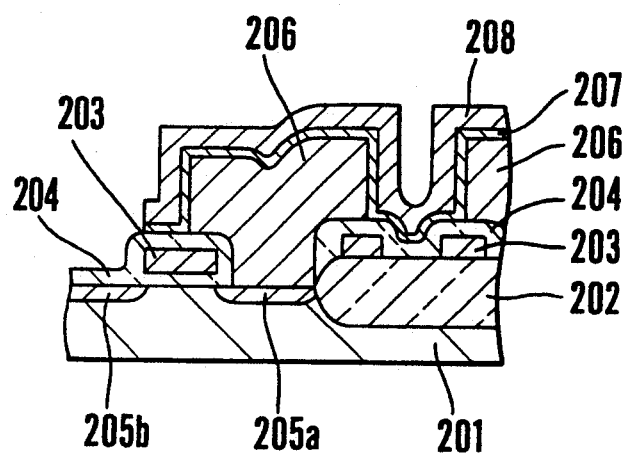
FIG. 1 is a cross sectional view illustrating a prior art semiconductor device.

Then, with the aid of a chemical gas phase reaction between the stock gas yielded by the vaporization of the organic tantalum (Ta($OC_2H_5$)$_5$) using the fabrication apparatus of FIG. 1, a capacitive insulating film 107 consisting of the tantalum oxide ($Ta_2O_5$) film is formed over the entire surface of the substrate including the storage node electrode 106. Further, for reducing a leakage current through the capacitive insulating film 107 a heat treatment with oxygen gas is carried out as illustrated in FIG. 3B.

In succession, there are deposited on the entire surface of the substrate a 50~400 nm thick titanium nitride film by sputtering or reactive sputtering and then a several to several tens nm titanium film by sputtering. Additionally, an aluminum metal film is deposited over the entire surface of the substrate. Thereafter, as illustrated in FIG. 3C, the aluminum metal film, titanium film, titanium nitride film, and capacitive insulating film 107 are etched successively by a known photolithography technique to form a first plate electrode 108a composed of a laminated film of the titanium nitride film and the titanium film and a second plate electrode 108b composed of the aluminum metal film. For improving adhesion properties between the titanium nitride film and the aluminum metal film a titanium film is disposed therebetween.

Figure 4:
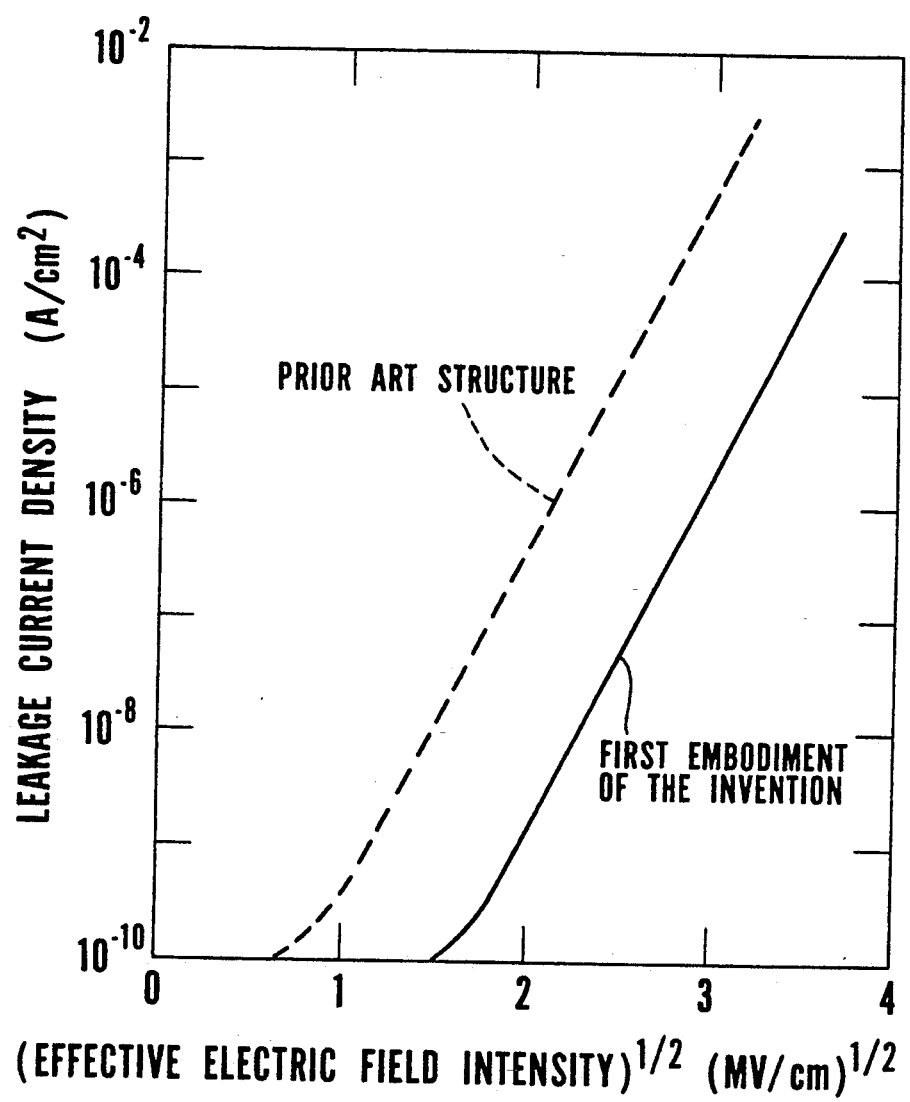
FIG. 4 is a graphical view illustrating for comparison a leakage current characteristic of the first embodiment of the semiconductor device of the present invention and the prior art device.

Referring to FIG. 4, a leakage current characteristic of the capacitive insulating film in the first concrete example is illustrated in the form of a graphical representation as a full line. As obviously evidence in the same figure, it is understood that the present embodiment is more excellent than the prior art structure in the leakage current characteristic. This originates from a fact that the titanium nitride film formed on the surface of the tantalum oxide film serves as a carrier film to prevent aluminum from invading into the tantalum oxide film and further a fact that titanium in the titanium nitride film gets mixed in a leakage path (such as dangling bonds) in the tantalum oxide film.

Although in the first concrete example the first and second plate electrodes of the aforementioned arrangement were employed, the same effect can be obtained even for the case where the first plate electrode is formed with a single layer titanium nitride film and the second plate electrode with a high melting point metal film. Further, the method of fabrication of the tantalum oxide film is not limited to the foregoing method, and even for the case where there is employed as the capacitive insulating film a tantalum oxide film formed by a plasma chemical gas phase reaction using tantalum chloride ($TaCl_5$) stock gas and nitrous oxide ($N_2O$) gas, for example, the same effect as in the first concrete example can be manifested.

Figure 5A:
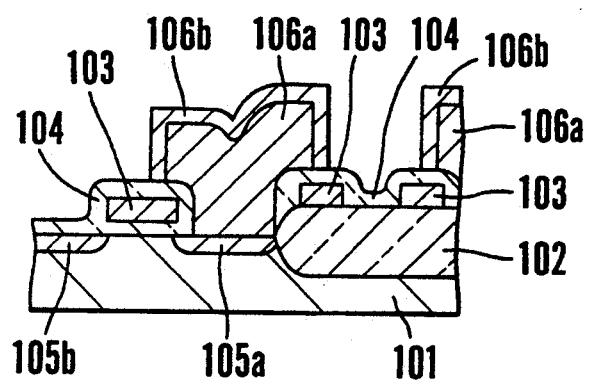
FIGS. 5A and 5B are views each illustrating processes of a second concrete example of the fabrication method of the semiconductor device of the present invention.

In the following, a second concrete example will be described with respect to a second fabrication method thereof with reference to FIGS. 5A and 5B in which fabrication processes of a DRAM capacitive structure are illustrated in a cross section.

First, a first storage node electrode 106a comprising phosphorus doped polycrystalline silicon is connected with the impurity diffusion layer 105a in accordance with the same method as the fabrication method of the first concrete example. Then, there is formed a second storage node electrode 106b comprising the laminated film of the titanium film and the titanium nitride film both covering the surface of the storage node electrode 106a, as illustrated in FIG. 5A. The titanium film is provided to improve adhesion properties between the polycrystalline silicon first storage node electrode 106a and the titanium nitride film. Instead of the titanium film other high melting point metal films may be employed.

Figure 5B:
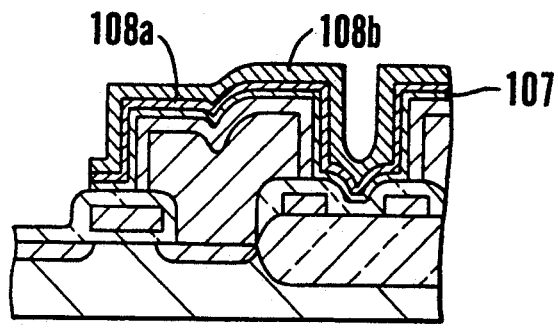

In succession, as in the first fabrication method, there are formed the capacitive insulating film 107 comprising a tantalum oxide film, the first plate electrode 108a comprising a laminated film of a titanium nitride film and a titanium film, and the second plate electrode 108b comprising an aluminum metal film, as illustrated in FIG. 5B. Specific dielectric constants of the capacitive insulating film in the second concrete example yielded by the second fabrication method with respect to capacitive insulating film thicknesses are more excellent than those of the first concrete example. While in the capacitive insulating film in the first concrete example the specific dielectric constant has film thickness dependency, in the second concrete example the specific dielectric constant does not have such film thickness dependency and has substantially constant values which are further substantially coincident with the bulk value ($\epsilon$ r-25) of the tantalum oxide.

According to the present invention, as described above, in the capacitive structure including the tantalum oxide as the capacitive insulating film the titanium nitride film is formed between the upper layer electrode and the capacitive insulating film. Accordingly, there is ensured a semiconductor device including the capacitive structure with a less leakage current than the prior art capacitive structure.

What is claimed is:

1. A method of fabrication of a semiconductor device including a capacitive structure comprising a lower layer electrode consisting of a silicon material, a capacitive insulating film consisting of a tantalum oxide film and an upper layer electrode, said method comprising the steps of:
    forming said lower layer electrode;
    forming said capacitive insulating film covering said lower layer electrode;
    forming a first titanium nitride film covering said capacitive insulating film;
    forming a high melting point metal film covering said lower layer electrode; and
    forming a second titanium nitride film covering said high melting point metal film.

2. A method of fabrication according to claim 1, wherein said capacitive insulating film is formed after the step of forming said second titanium nitride film and said second titanium nitride film is located between said tantalum oxide film and said high melting point metal film.

3. A method of fabrication according to claim 1, wherein said tantalum oxide film is located between said lower layer electrode and said first titanium nitride film.

4. A method of fabrication according to claim 1, further comprising forming a layer of aluminum on said first titanium nitride film.

5. A method of fabrication according to claim 1, further comprising forming a layer of titanium covering said first titanium nitride film.

6. A method of fabrication according to claim 1, further comprising forming a layer of high melting point metal covering said first titanium nitride film.

7. A method of fabrication according to claim 1, wherein said high melting point film comprises a film of titanium on said lower layer electrode, said film of titanium being between said lower layer electrode and said tantalum oxide film.

8. A method of fabrication according to claim 1, wherein said lower layer electrode comprises polycrystalline silicon.

9. A method of fabrication according to claim 1, wherein said lower layer electrode comprises doped polycrystalline silicon.

10. A method of fabrication according to claim 1, wherein said lower layer electrode comprises phosphorous doped polycrystalline silicon.

11. A method of fabrication according to claim 1, further comprising steps of forming a titanium film on the first titanium nitride film and forming an aluminum metal film on the titanium film.

12. A method of fabrication according to claim 1, further comprising forming a film of high melting point metal on the first titanium nitride film.

* * * * *